United States Patent [19]
Srinivasan et al.

[11] Patent Number: 5,852,569
[45] Date of Patent: Dec. 22, 1998

[54] CONTENT ADDRESSABLE MEMORY MULTIPLE MATCH DETECTION CIRCUIT

[75] Inventors: Varadarajan Srinivasan, Los Altos Hills; Sandeep Khanna, Santa Clara; Sanjay V. Gala; Ketan K. Mehta, both of Sunnyvale, all of Calif.

[73] Assignee: Quality Semiconductor, Inc., Santa Clara, Calif.

[21] Appl. No.: 858,997

[22] Filed: May 20, 1997

[51] Int. Cl.$^6$ .................................................. G11C 15/00
[52] U.S. Cl. ................ 365/49; 365/189.07; 365/189.08; 711/108
[58] Field of Search ................ 365/49, 189.07, 365/189.08; 711/108

[56] References Cited

U.S. PATENT DOCUMENTS

| | | | |
|---|---|---|---|
| 4,559,618 | 12/1985 | Houseman et al. | 365/49 |
| 4,785,428 | 11/1988 | Bajwa et al. | 365/233 |
| 4,899,307 | 2/1990 | Lenoski | 365/78 |
| 5,383,146 | 1/1995 | Threewitt | 365/49 |
| 5,406,508 | 4/1995 | Hayashibara | 365/49 |
| 5,422,838 | 6/1995 | Lin | 365/49 |
| 5,446,686 | 8/1995 | Bosnyak et al. | 265/49 |
| 5,454,094 | 9/1995 | Montove | 365/49 |

*Primary Examiner*—David C. Nelms
*Assistant Examiner*—Hien Nguyen
*Attorney, Agent, or Firm*—Pennie & Edmonds LLP

[57] ABSTRACT

A circuit and a method for detecting the presence of multiple active match lines in a content addressable memory is disclosed. The circuit includes at least one bus group for expressing a unary-encoded address portion of an active match line and, for each match line, an encoding circuit capable of activating a single member of each bus group according to the address of that match line when that match line is active. The multiple match detection circuit advantageously uses the property that each match line has a unique address, and therefore if there is more than one active match line, at least one bus group will have at least two active members. The multiple match detection circuit further comprises, for each bus group, an bus group detection-OR circuit for computing the logical bus group detection-OR of the members of that bus group. The multiple match detection circuit further comprises an OR circuit for computing the logical OR of the outputs of the bus group detection-OR circuits, for providing a multiple match flag which is active when two or more match lines are active and which is inactive otherwise.

17 Claims, 9 Drawing Sheets

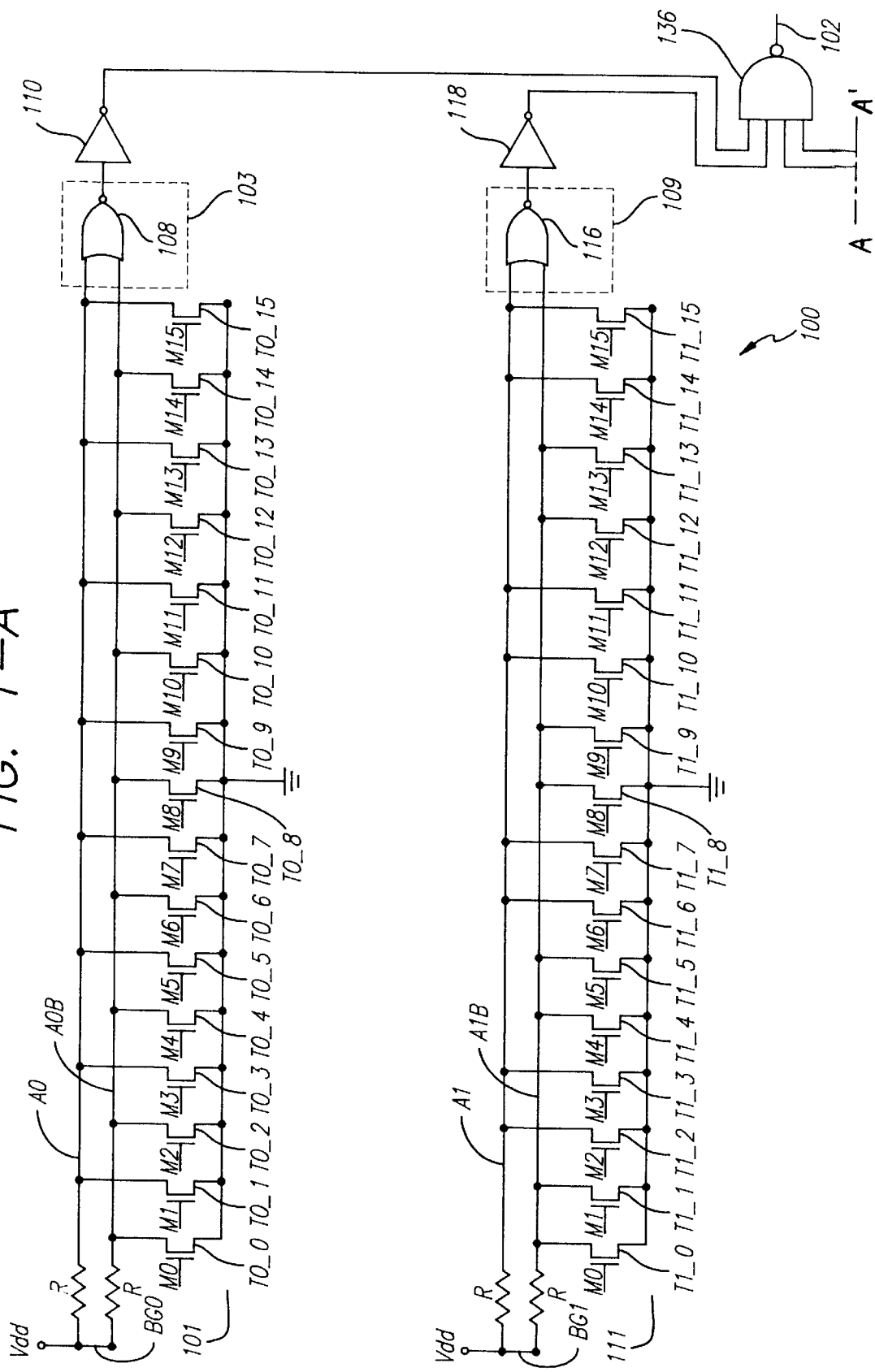
FIG. 1-A

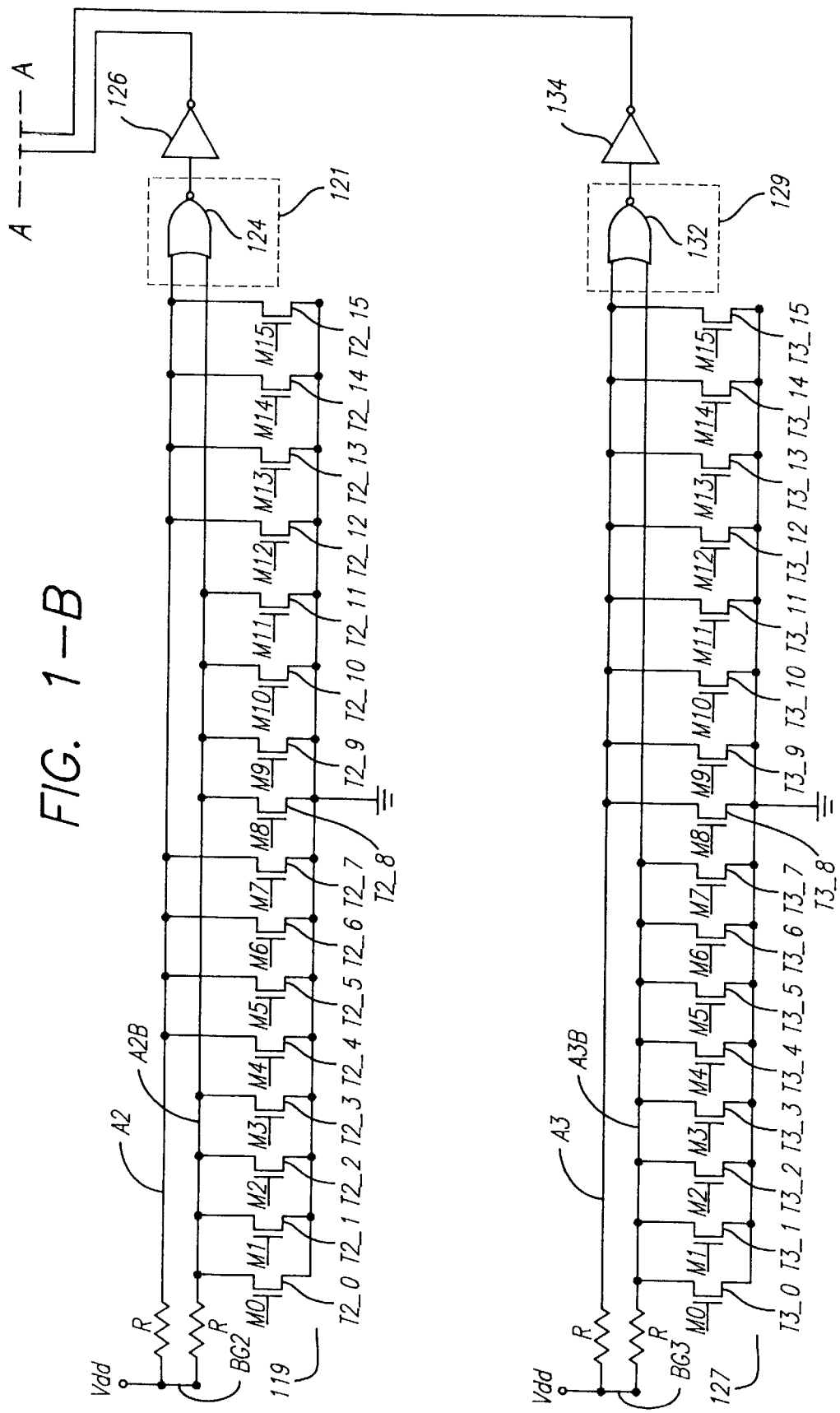
FIG. 1-B

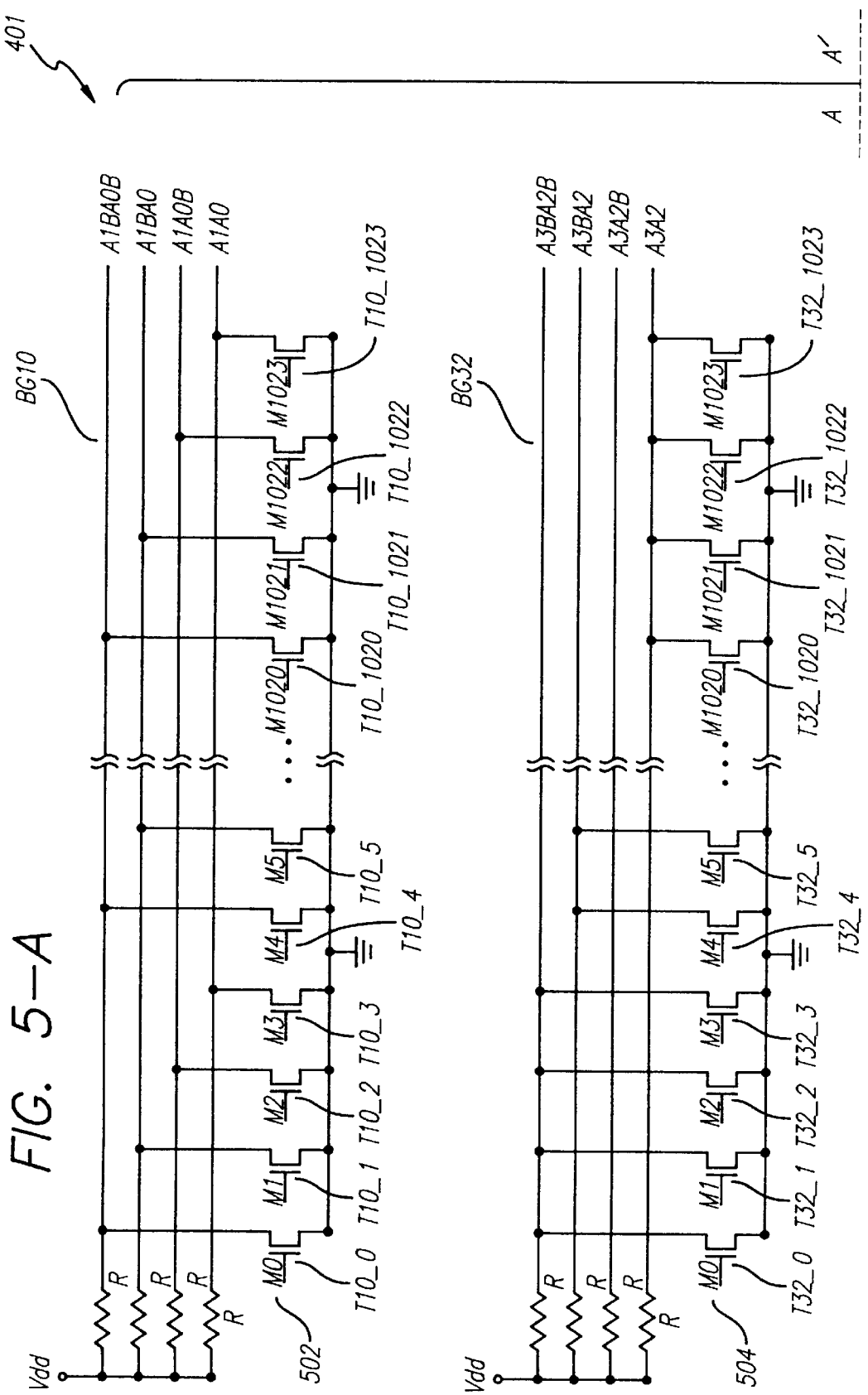
FIG. 5-A

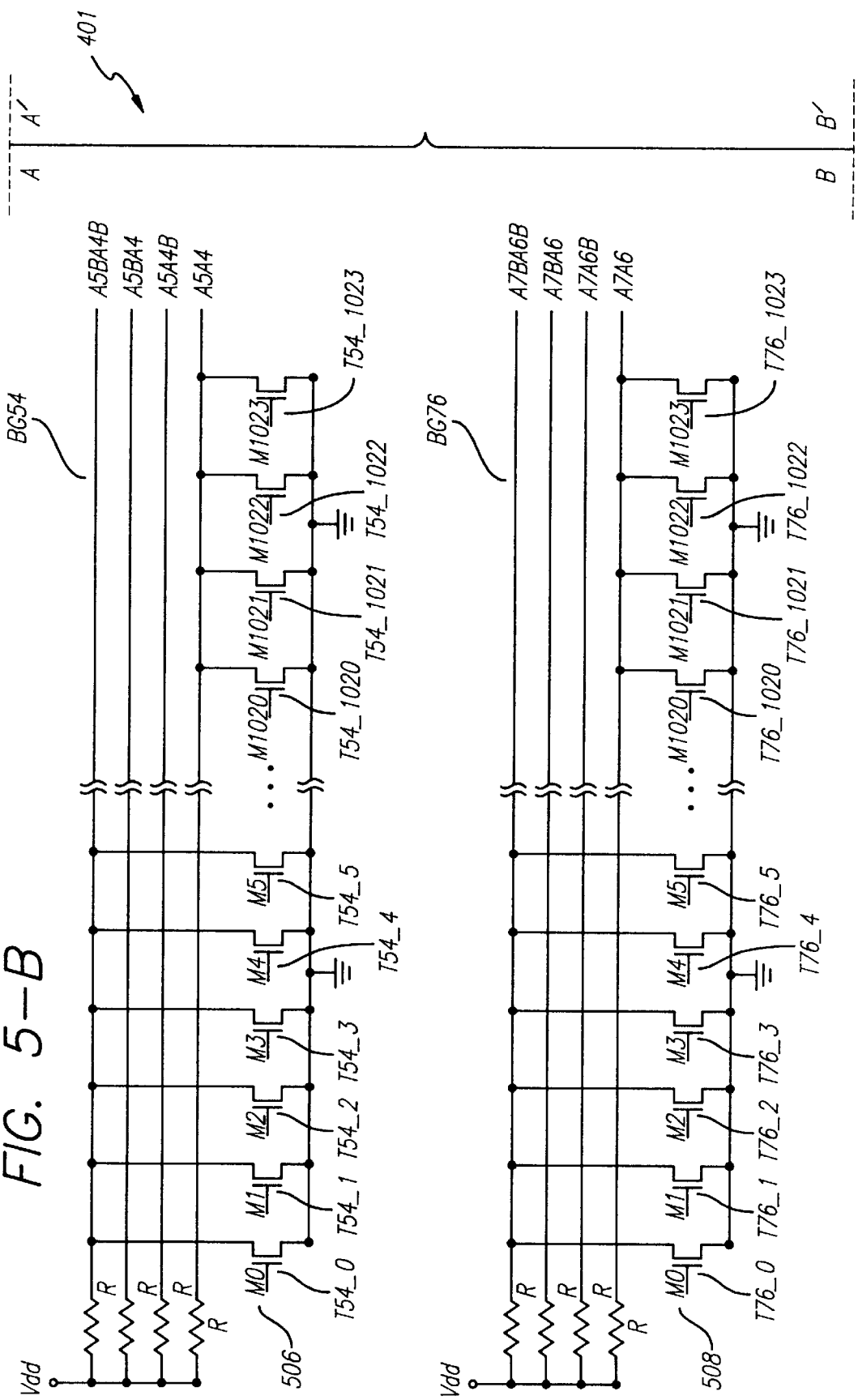
FIG. 5-B

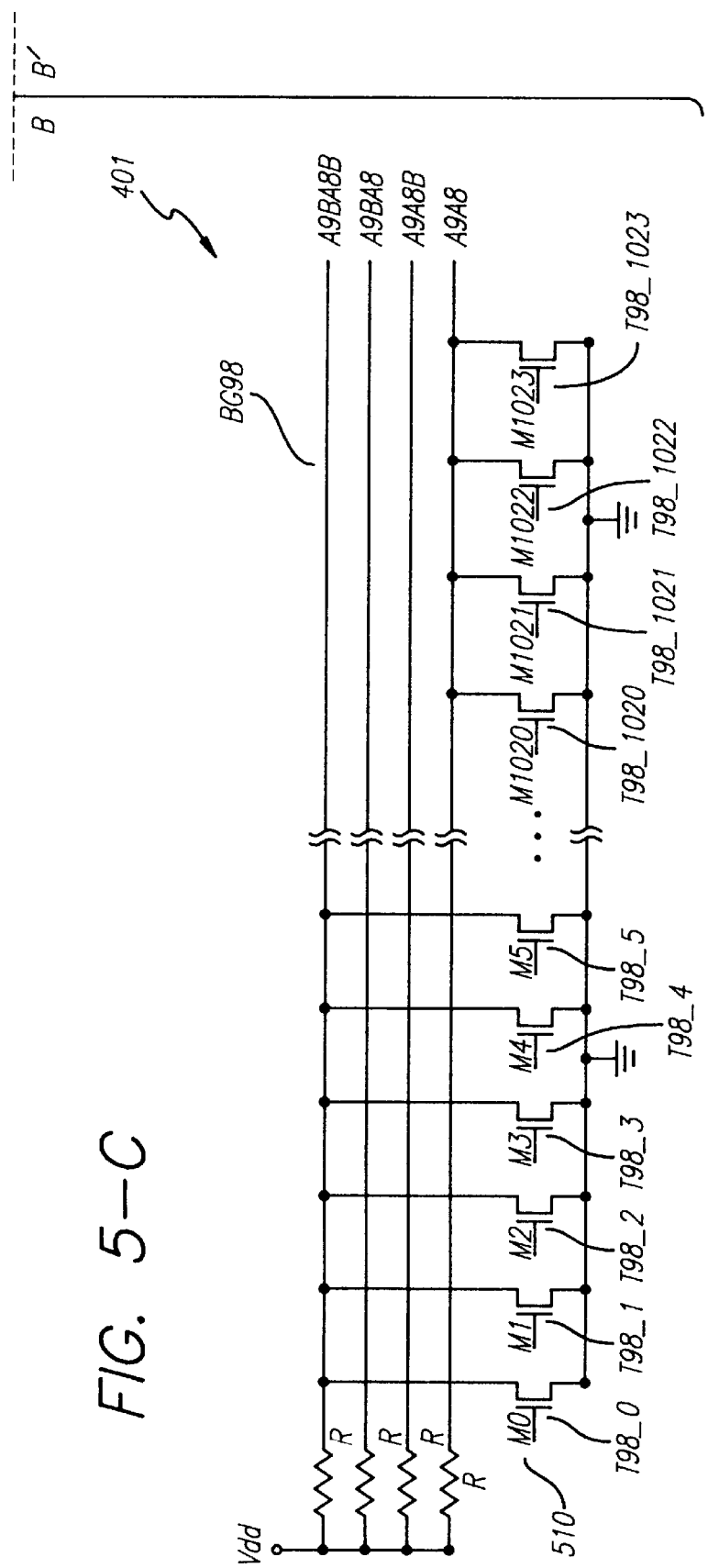
FIG. 5-C

CONTENT ADDRESSABLE MEMORY MULTIPLE MATCH DETECTION CIRCUIT

CROSS-REFERENCE TO RELATED APPLICATIONS

The subject matter of this application is related to the subject matter of U.S. patent application Ser. No. 08/729,626, entitled "Content Addressable Memory and Random Access Memory Partition Circuit," filed Oct. 10, 1996, and U.S. patent application Ser. No. 08/866,645, entitled "Priority Encoder for a Content Addressable Memory," filed May 30, 1997, both of which are assigned to the assignee of the present invention. The above applications are hereby incorporated by reference into the present application.

FIELD OF THE INVENTION

The present invention relates to the field of content addressable memories. In particular, the present invention relates to an apparatus for detecting when two or more match lines of a content addressable memory are simultaneously active.

BACKGROUND OF THE INVENTION

A content addressable memory ("CAM") is a memory device in which data is accessed and modified based upon the content of the stored data, rather than on the location in which that data is stored. A CAM generally includes multiple data storage locations comprising multiple memory cells. Unlike random access memory ("RAM"), all data words in the storage locations of a CAM may be simultaneously compared with a search word stored in a comparand register. As each stored data word is compared with the search word, a match line for that stored data word is activated if that stored data word matches the search word.

A CAM of $2^N$ data words has $2^N$ match lines, one match line for each data word. Each data word and match line combination has a unique N-bit address within the CAM. For any match cycle there may be zero, one, or up to $2^N$ match lines activated. Typically, a CAM comprises a priority encoder for generating an N-bit address corresponding to the lowest-addressed active match line. Using this N-bit address, corresponding locations in a RAM associated with the CAM may be read from and/or written to.

When more than one match line is activated, it may be desirable to read from or write to each of the multiple addresses having an active match line, or to otherwise utilize information related to the address of each active match line. It is therefore desirable for a signal, called a multiple match flag signal, to be generated after each match cycle for indicating whether more than one match line is active. Using the multiple match flag, along with tag bits associated with each CAM data word, the CAM may cause the priority encoder to successively generate N-bit addresses corresponding to each of the active match lines for use in the system incorporating the CAM. It is desirable for the multiple match flag to be generated quickly, preferably completing before the generation of the priority-encoded address by the priority encoder, and for the multiple match flag to be generated reliably for avoiding false positives or missed multiple matches.

One type of multiple match detection circuit is disclosed in U.S. Pat. No. 5,446,686 to Bosnyak et. al., entitled "Method and Apparatus for Detecting Multiple Address Matches in a Content Addressable Memory" (hereinafter "Bosnyak"). Bosnyak discloses an analog technique for detecting multiple matches wherein each match line is coupled to the gate of a transistor, each transistor drawing current from a common node when activated (see Bosnyak, FIG. 6). The resulting current at the common node is then compared to a reference current at a comparator, the reference current typically being fixed at about 1.5 times the current of a typical transistor when activated by a match line. When more than one match line is activated, the current at the common node is greater than the reference current, and the comparator indicates a multiple match. Otherwise, no multiple match is indicated.

Analog multiple match circuits such as that disclosed in Bosnyak contain a key disadvantage which makes their use in large CAMs difficult. In particular, they require the use of a precision current comparator for comparing the match current with the reference current. As a result, analog multiple match circuits have low noise immunity. Particularly in large CAM arrays, low noise immunity may cause false positives or missed multiple matches.

Another multiple match detection circuit is presented in U.S. Pat. No. 5,454,094 to Montove, entitled "Method and Apparatus for Detecting Multiple Matches in a Content Addressable Memory" (hereinafter "Montove"). Montove discloses a digital technique for detecting multiple matches in a $2^N$ match line CAM. In particular, Montove discloses a logarithm index generator 102 for generating a "logarithm index" corresponding to the state of the match lines (see Montove FIG. 1). The "logarithm index" represents the bit-wise OR of the N-bit addresses of each active match line (Montove, col. 4 lines 10–20). The logarithm index is then converted by a converter 103 into a unary-encoded signal on $2^N$ lines, and each line is then inverted by inverters 109. As shown in FIG. 1 of Montove, each output is then ANDed with its corresponding match line, and the results of these AND operations are then ORed to produce a multiple match signal.

Although it is digital, the multiple match detection circuit disclosed in Montove is not amenable for use with large CAM arrays. In particular, after the logarithm index generator 102 generates an N-bit "logarithm index" from the $2^N$ match lines, the converter 103 then re-generates a $2^N$-line signal from these N input bits for logical comparison to the match lines. This results in undesired circuit complexity and time delays, especially as the number of match lines grows large. For example, for a 1024-match line CAM, the Montove circuit would require the generation of 1024 signals at the output of converter circuit 103, and would require 1024 inverters and 1024 AND gates for comparison with the match line signals. Moreover, the input to inverter 113, which is coupled to the sources of 1024 N-channel transistors 111, would have an excessively high capacitance causing excessive propagation delays.

It is therefore an object of the invention to provide a multiple match detection circuit adaptable for use with large CAM arrays.

It is another object of the present invention to provide a multiple match detection circuit having a high noise immunity for producing reliable results.

It is still another object of the present invention to provide multiple match detection circuit adaptable for use with large CAM arrays while occupying a small circuit area and while providing fast results even as the number of match lines grows large.

SUMMARY OF THE INVENTION

These and other objects of the present invention are provided in a multiple match detection circuit comprising at least one bus group for expressing a unary-encoded address portion of an active match line. The multiple match detection circuit further comprises, for each match line, an encoding circuit capable of activating a single member of each bus group according to the address of that match line when that match line is active. The multiple match detection circuit advantageously uses the property that each match line has a unique address. Therefore, if there is more than one active match line, at least one bus group will have at least two active members. The multiple match detection circuit further comprises, for each bus group, a bus group detection circuit for determining whether two or more members of that bus group are active. The multiple match detection circuit further comprises a logical OR circuit for activating a multiple match flag when at least one bus group detection circuit has an active output.

In one embodiment, the multiple match detection circuit is capable of receiving $2^N$ match lines, and the unary-encoded address portion represented on each bus group represents a unique set of m bits of an N-bit match line address. Because m bits can take on $2^m$ values, each bus group has $2^m$ members for representing, in a unary-encoded form, each of the $2^m$ values. Each encoding circuit unary-encodes an m-bit value onto the bus group by activating a single unique member of the bus group corresponding to that m-bit value and by not activating other members. In this embodiment, the multiple match detection circuit comprises N/m bus groups and N/m bus group detection circuits, each bus group detection circuit having $2^m$ inputs and having an output. In this embodiment, the logical OR circuit has N/m inputs and activates the multiple match flag when at least one bus group detection circuit has an active output.

In another embodiment, each encoding circuit comprises an input lead for coupling to the match line associated with the encoding circuit and a plurality of activation circuits, one activation circuit for each bus group, for activating a single member of each bus group. Each activation circuit comprises a transistor having a gate coupled to the match line, a first current node coupled to the single member of said bus group, and a second current node coupled to a constant voltage source.

In another embodiment, the value N is equal to 10 and m is equal to 2, and the multiple match detection circuit comprises $2^{10}$=1024 inputs for coupling to a 1024 input CAM. The multiple match detection circuit further comprises 5 bus groups, each bus group having 4 members for representing a unary-encoded address portion corresponding to 2 bits of a 10-bit address.

The multiple match detection circuit according to the present invention is advantageous in that it is fully digital for providing high noise immunity. Furthermore, circuit complexity and power consumption are reduced, and circuit speed is increased.

BRIEF DESCRIPTION OF THE DRAWINGS

The above mentioned objects and other objects, features, and advantages of the invention may be better understood by referring to the following detailed description, which should be read in conjunction with the accompanying drawings in which:

FIG. 1 shows a sixteen match line multiple match detection circuit according to a first embodiment of the present invention;

FIG. 4 and 5 shows a 1024-match line multiple match detection circuit according to a third embodiment of the present invention.

DETAILED DESCRIPTION OF THE INVENTION

Figure 2:
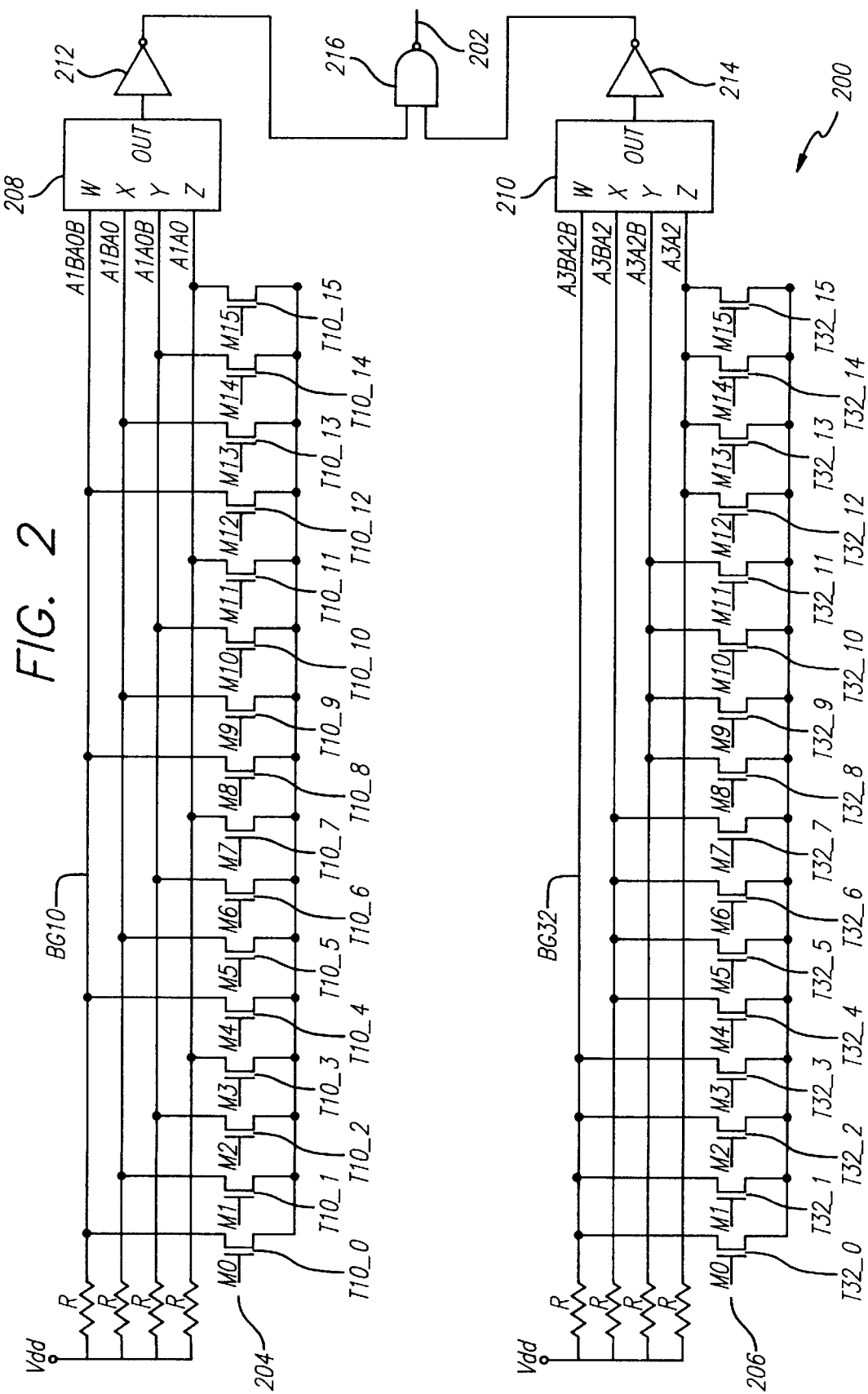
FIG. 2 shows a 1024-match line multiple match detection circuit according to a second embodiment of the present invention.

FIG. 1 illustrates a sixteen match line multiple match detection circuit 100 according to a first embodiment of the present invention. Multiple match detection circuit 100 comprises sixteen inputs M0–M15 for coupling to sixteen match lines of a CAM. In the present embodiment, each match line coupled to inputs M0–M15 is active high in that the match line is driven to a logic high value when a match occurs between the CAM search word and the its associated CAM data word. However, the invention is not so limited and is easily adaptable for active low match lines. Multiple match detection circuit 100 generates a single output at a match flag node 102 which is a logic high value when more than one input M0–M15 is high, and which is low otherwise.

Multiple match detection circuit 100 is adapted for $2^4$ match lines, and there are thus 4 address bits used in representing the addresses of the match lines. Multiple match detection circuit 100 comprises a bus group BG0 comprising two members A0 and A0B, a bus group BG1 comprising two members A1 and A1B, a bus group BG2 comprising two members A2 and A2B, and a bus group BG3 comprising two members A3 and A3B. When not activated, each bus group is set to a high logic value by any of a variety of methods, FIG. 1 showing the simple method of coupling each member to a supply voltage Vdd through a pullup resistor R.

Multiple match detection circuit 100 comprises an encoding circuit 101 for driving the members A0 and A0B of bus group BG0. In particular, encoding circuit 101 drives bus group BG0 with an active-low, unary-encoded representation of the lowest order bit of the 4-bit address of each active match line at inputs M0–M15. As used in the present embodiment, the unary-encoded representation of a single bit can be expressed on the two members A0B and A0 with a "1" being represented by activating member A0, and with a "0" being represented by activating member A0B. Encoding circuit 101 comprises an n-channel transistor T0_0 coupled between member A0B and ground as shown in FIG. 1 and having a gate coupled to match line input M0. The 4-bit binary address of the match line at M0 is 0000, which has a lowest-order bit (or zeroth bit) equal to zero. When the match line at M0 goes high, transistor T0_0 activates member A0B by setting it low, thus expressing a unary-encoded "0" as desired. Encoding circuit 101 further comprises an n-channel transistor T0_1 coupled between member A0 and ground as shown in FIG. 1 and having a gate coupled to match line input M1. The 4-bit binary address of the match line at M1 is 0001, which has a lowest-order bit (or zeroth bit) equal to 1. When the match line at M1 goes high, transistor T0_1 activates member A0 by setting it low, thus expressing a unary-encoded "1" as desired.

In a like manner, encoding circuit 101 further generally comprises transistors T0_j, where j=2, 4, 6, 8, 10, 12, and 14 each coupled between member A0B and ground as shown in FIG. 1 and having a gate coupled to match line inputs M2, M4, M6, M8, M10, M12, and M14, respectively. Importantly, the zeroth order bit of the 4-bit binary address of each of these match lines is 0. When any of these even-numbered match lines goes high, the member A0B is set to low, thus expressing a unary-encoded "0" as desired.

Encoding circuit 101 further generally comprises transistors T0__k, where k=1, 3, 5, 7, 9, 11, 13, and 15 each coupled between member A0 and ground as shown in FIG. 1 and having a gate coupled to match line inputs M1, M3, M5, M7, M9, M11, and M13, respectively. The zeroth order bit of the 4-bit binary address of each of these match lines is 1. When any of these odd-numbered match lines goes high, the member A0 is set to low, thus expressing a unary-encoded "1" as desired.

Importantly, the encoding circuit 101 activates both of the members A0 and A0B when two match lines having different zeroth order bits in their addresses. When both members A0 and A0B are active, there must be a multiple match condition. Multiple match detection circuit 100 comprises a bus group detection circuit 103 for detecting whether both A0 and A0B are active. Bus group detection circuit 103 comprises a NOR gate 108 having a first input coupled to member A0, a second input coupled to member A0B, and an output. Recalling that the members A0 and A0B are logic low when active, the bus group detection circuit 103 provides the following truth table:

TABLE 1

Truth Table for Bus Group Detection Circuit 103

| A0 | A0B | Output of NOR gate 108 |
|---|---|---|
| 0 | 0 | 1 |
| 0 | 1 | 0 |
| 1 | 0 | 0 |
| 1 | 1 | 0 |

As shown by the above truth table, bus group detection circuit 103 provides a logic high output at the output of NOR gate 108 when both A0 and A0B are 0, i.e., active. Otherwise, the output of NOR gate 108 is 0. As shown in FIG. 1, the output of NOR gate 108 is coupled to a logical OR circuit comprising inverters 110, 118, 126, and 134, and a NAND gate 102. In particular, the output of NOR gate 108 is coupled to the input of inverter 110. The logical OR circuit simply provides the logical OR of the inputs of each of the 5zinverters 110, 118, 126, and 134 at an output of NAND gate, which is directly connected to the multiple match flag node 102. Accordingly, if both A0 and A0B are 0, the input of inverter 110 will be high, and thus the multiple match flag node 102 will be high for indicating a multiple match. Otherwise, the bus group BG0 will have no effect on the multiple match flag node 102 and, unless an input to at least one of inverters 118, 126, or 134 is high, the multiple match flag node 102 will remain low.

It is noted that if both A0 and A0B are low, a multiple match has definitely occurred. However, if A0 and A0B are not both low, a multiple match may still have occurred. For example, if both M2 and M4 are activated, only A0B is set low and the encoding circuit 101 will not itself detect the multiple match. This is because the unary-encoded expression of the zeroth order bit of 2 (0010) and 4 (0100) are the same. However, where two match lines are activated, there will always be a difference of at least one bit in their addresses and, according to the present invention, this difference will always be picked up by circuitry associated with at least one of the bus groups containing the unary-encoded expressions of the respective address bits. In this example, there are differences in both the first-order bit and second-order bit which will be detected by circuitry associated with bus groups BG1 and BG2, as discussed below.

Multiple match detection circuit 100 further comprises an encoding circuit 111 for driving the members A1 and A1B of bus group BG1. Encoding circuit 111 drives bus group BG1 with an active-low, unary-encoded representation of the first order bit of the 4-bit address of each active match line at inputs M0–M15. Encoding circuit 111 generally comprises transistors T1__j, where j=0, 1, 4, 5, 8, 9, 12, and 13, each coupled between member A1B and ground and having a gate coupled to match line inputs M0, M1, M4, M5, M8, M9, M12, and M13, respectively. Importantly, the match line address for each of the transistors coupled to member A1B has a first order bit equal to 0 (00$\underline{0}$0, 00$\underline{0}$1, 01$\underline{0}$0, 01$\underline{0}$1, 10$\underline{0}$0, 10$\underline{0}$1, 11$\underline{0}$0, 11$\underline{0}$1). When any of these match lines goes high, the member A1B is set to low, thus expressing a unary-encoded "0" as desired.

Encoding circuit 111 further comprises transistors T1__k, where k=2, 3, 6, 7, 10, 11, 14 and 15, each coupled between member A1 and ground as shown in FIG. 1 and having a gate coupled to match line inputs M2, M3, M6, M7, M10, M11, M14, and M15, respectively. Importantly, the match line address for each of the transistors coupled to member A1 has a first order bit equal to 1 (00$\underline{1}$0, 00$\underline{1}$1, 01$\underline{1}$0, 01$\underline{1}$1, 10$\underline{1}$0, 10$\underline{1}$1, 11$\underline{1}$0, 11$\underline{1}$1). When any of these match lines goes high, the member A1 is set to low, thus expressing a unary-encoded "1" as desired.

Multiple match detection circuit 100 further comprises a bus group detection circuit 109 comprising a NOR gate 116. Bus group detection circuit 109 has a truth table similar to that of Table 1 except as applied to bus group BG1. Thus, bus group detection circuit 109 provides a logic high signal at the output NOR gate 108 when both A1 and A1B are low, and produces a logic low signal otherwise. In this manner, if both A1 and A1B are simultaneously low, the output of NOR gate 116 will be high and therefore the output of the logical OR circuit at the multiple match flag 102 will be high. Continuing the previous example, where match lines at M2 (0010) and M4 (0100) are both active, member A1B will be driven low by transistor T1__4 and member A1 will be driven low by transistor T1__2. This will cause the multiple match flag 102 to be driven high, as desired.

Multiple match detection circuit 100 further comprises an encoding circuit 119 for driving the members A2 and A2B of bus group BG2. Encoding circuit 119 comprises transistors T2__j coupled between A2B and ground, where j represents those match line addresses having a second order bit equal to 0, i.e., 0 (0$\underline{0}$00), 1 (0$\underline{0}$01), 2 (0$\underline{0}$10), 3 (0$\underline{0}$11), 8 (1$\underline{0}$00), 9 (1$\underline{0}$01), 10 (1$\underline{0}$10), and 11 (1$\underline{0}$11). Encoding circuit 119 further comprises transistors T2__k coupled between A2 and ground, where k represents those match line addresses having a second order bit equal to 1, as shown in FIG. 1. In this manner, multiple match lines having addresses differing in the second order bit will cause both of members A2 and A2B to go low. This will be detected by a bus group detection circuit 121 comprising NOR gate 124 coupled as shown in FIG. 1 and having a truth table similar to that of Table 1. Continuing the previous example where match lines at M2 and M4 are activated, member A2B will be set to zero by transistor T2__2 and member A2 will be set to zero by transistor T2__4, which will cause multiple match flag node 102 to be set to high as desired.

Finally, multiple match detection circuit 100 comprises an encoding circuit 127 for driving the members A3 and A3B of bus group BG2. Encoding circuit 127 comprises transistors T3_j coupled between A3B and ground, where j represents those match line addresses having a third order bit equal to 0, and further comprises transistors T3_k coupled between A3 and ground, where k represents those match line addresses having a third order bit equal to 1, as shown in FIG. 1. In this manner, multiple match lines having addresses differing in the third order bit will cause both of members A3 and A3B to go low. This will be detected by a bus group detection circuit 129 comprising a NOR gate 132 coupled as shown in FIG. 1 and having a truth table similar to that of Table 1. Accordingly, if two match lines having addresses which differ in the third order bit are active, the multiple match flag 102 will be activated by the logical OR circuit described previously, as desired.

In FIG. 1, the multiple match detection circuit 100 is capable of receiving $2^N$ match lines where N=4, and the unary-encoded address portion represented on each of the bus groups BG0–BG3 represents a single bit of an N-bit match line address. Importantly, the invention is not limited to the case where a single bus group encodes a single address bit. Rather, according to the present invention, address bits can be grouped together in groups of "m" address bits and then expressed in a unary-encoded format onto bus group members. It has been found that the number of circuit elements can be reduced and very large CAMs can be accommodated when multiple address bits are grouped together for unary-encoding. Because two different match lines will always have at least one group of "m" address bits which are different, there must be a multiple match when one or more unary-encoded bus groups has more than one active member.

FIG. 2 illustrates a 16 line multiple match detection circuit 200 according to a second embodiment of the present invention. Like the embodiment of FIG. 1, the embodiment of FIG. 2 is a sixteen line multiple match detection circuit, and thus is capable of receiving $2^N$ match lines where N=4. However, in this embodiment, the address bits are grouped together in groups of m=2 address bits for providing a simplified circuit configuration as compared to the circuit of FIG. 1. In this embodiment, the multiple match detection circuit comprises N/m=2 bus groups and N/m=2 bus group detection circuits, each bus group detection circuit having $2^m=2^2=4$ inputs and having an output. In this embodiment, the logical OR circuit has N/m=2 inputs and activates the multiple match flag when at least one bus group detection circuit has an active output.

Multiple match detection circuit 200 comprises sixteen inputs M0–M15 for coupling to sixteen match lines of a CAM. Multiple match detection circuit 200 generates a single output at a multiple match flag node 202 which is a logic high value when more than one input M0–M15 is high, and which is low otherwise.

As shown in FIG. 2, multiple match detection circuit 200 comprises a bus group BG10 for representing a unary-encoded form of the zeroth and first order bits of a 4-bit match line address, and a bus group BG32 for unary-encoding the second and third order bits of the 4-bit match line address. Multiple match detection circuit 200 comprises an encoding circuit 204 for receiving the input lines M0–M15 and for driving bus group BG10, the bus group BG10 comprising four members A1BA0B, A1BA0, A1A0B, and A1A0. Multiple match detection circuit 200 further comprises an encoding circuit 206 for receiving the input lines M0–M15 and for driving bus group BG32, the bus group BG320 comprising four members A2BA2B, A3BA2, A3A2B, and A3A2.

Bus group BG10 is driven by the input lines M0–M15 in a way which unary-encodes the zeroth order and first order bits of the address of active match lines onto its members. This is achieved as follows. For notational simplicity and clarity of disclosure, the term ADDR(n) will denote the 4-bit binary address of a match line coupled to the input line Mn, the term ADDR_10(n) will represent the zeroth and first order bits of that address, and the term ADDR_32(n) will represent the second and third order bits of that address.

When ADDR_10(n) of an active match line is equal to 00, the member A1BA0B is to be activated for representing that state of ADDR_10 (n) in unary form, and the other members will not be activated by that match line. When ADDR_10(n) of an active match is equal to 01, the member A1BA0 is to activated for representing that state of ADDR_10(n) in unary form, and the other members will not be activated by that match line. When ADDR_10(n) of an active match is equal to 10, the member A1A0B is to activated for representing that state of ADDR_10(n) in unary form, and the other members will not be activated by that match line. Finally, when ADDR_10(n) of an active match is equal to 11, the member A1A0 is to activated for representing that state of ADDR_10(n) in unary form, and the other members will not be activated by that match line. The members of bus group BG10 are kept high in an inactive state by precharge or pullup circuitry such as the simple pullup resistors R shown in FIG. 2, and are pulled low to represent an active state.

Encoding circuit 204 comprises 16 n-channel transistors T10_0 through T10_15 having their gates coupled to M0–M15, respectively, and their current channels coupled between the members of bus group BG10 and a ground node for achieving this result. In particular, where ADDR_10(n) is 00 (i.e. for n=0, 4, 8, and 12) the drain of transistor T10_n is coupled to member A1BA0B. Where ADDR_10(n) is 01 (i.e., for n=1, 5, 9, and 13) the drain of transistor T10_n is coupled to member A1BA0. Where ADDR_10(n) is 10 (i.e., for n=2, 6, 10, and 14) the drain of transistor T10_n is coupled to member A1A0B. Finally, where ADDR_10(n) is 11 (i.e., for n=3, 7, 11, and 15) the drain of transistor T10_n is coupled to member A1A0.

Multiple match detection circuit 200 further comprises an encoding circuit 206 for driving the bus groups BG32 such that bus group BG32 contains the appropriate unary-encoded form of the two bits ADDR_32(n) of an active match line. Encoding circuit 206 comprises 16 n-channel transistors T32_0 through T32_15 having their gates coupled to M0–M15, respectively, and their current channels coupled between the members of bus group BG32 as shown in FIG. 2. The connections of the drains of the transistors of encoding circuits 204 and 206 are summarized in the following table:

TABLE 2

Matrix for Encoding Circuits 204 and 206

| Bus Group | Address Bit Values | Transistor Connection |
|---|---|---|
| BG10 | ADDR_10(n) = 00 | T10_n to A1BA0B |
|  | = 01 | A1BA0 |
|  | = 10 | A1A0B |
|  | = 11 | A1A0 |
| BG32 | ADDR_32(n) = 00 | T32_n to A3BA2B |
|  | = 01 | A3BA2 |
|  | = 10 | A3A2B |
|  | = 11 | A3A2 |

Table 2 is used as follows for determining the appropriate connections in FIG. 2. For each bus group, such as bus group BG32 it is required to connect each of transistors T32_0 through T32_15 to the appropriate bus group member. Starting with n=0 and increasing n to n=15, determine, for each value of n, whether ADDR_32(n) is equal to 00, 01, 10, or 11. Couple the transistor T32_n to the member of bus group BG32 indicated in the corresponding row of Table 2. Thus, for example, for n=9 (for which ADDR(n)=1001, it is noted that ADDR_32(n)=10. Therefore, as indicated in Table 2, the drain of transistor T32_9 is to coupled to member A3A2B in FIG. 2.

According to the present invention, whenever there is more than one active match line, there will always be at least one bus group having more than one active member. When there is only one active match line, there will be no more than one member of each bus group which is active. Accordingly, multiple match detection circuit 200 comprises bus group detection circuits 208 and 210 for coupling to bus groups BG10 and BG32, respectively. Each of the bus group detection circuits 208 and 210 comprises four inputs W, X, Y, and Z, and an output OUT coupled as shown in FIG. 2. The truth table for a representative bus group detection circuit 208 is as follows:

TABLE 3

Truth Table for Bus Group Detection Circuit 208

| W<br>A3BA2B | X<br>A3BA2 | Y<br>A3A2B | Z<br>A3A2 | OUT |
|---|---|---|---|---|
| 0 | 0 | 0 | 0 | 1 |
| 0 | 0 | 0 | 1 | 1 |
| 0 | 0 | 1 | 0 | 1 |
| 0 | 0 | 1 | 1 | 1 |
| 0 | 1 | 0 | 0 | 1 |
| 0 | 1 | 0 | 1 | 1 |
| 0 | 1 | 1 | 0 | 1 |
| 0 | 1 | 1 | 1 | 0 |
| 1 | 0 | 0 | 0 | 1 |
| 1 | 0 | 0 | 1 | 1 |
| 1 | 0 | 1 | 0 | 1 |
| 1 | 0 | 1 | 1 | 0 |
| 1 | 1 | 0 | 0 | 1 |
| 1 | 1 | 0 | 1 | 0 |
| 1 | 1 | 1 | 0 | 0 |
| 1 | 1 | 1 | 1 | 0 |

Figure 3:
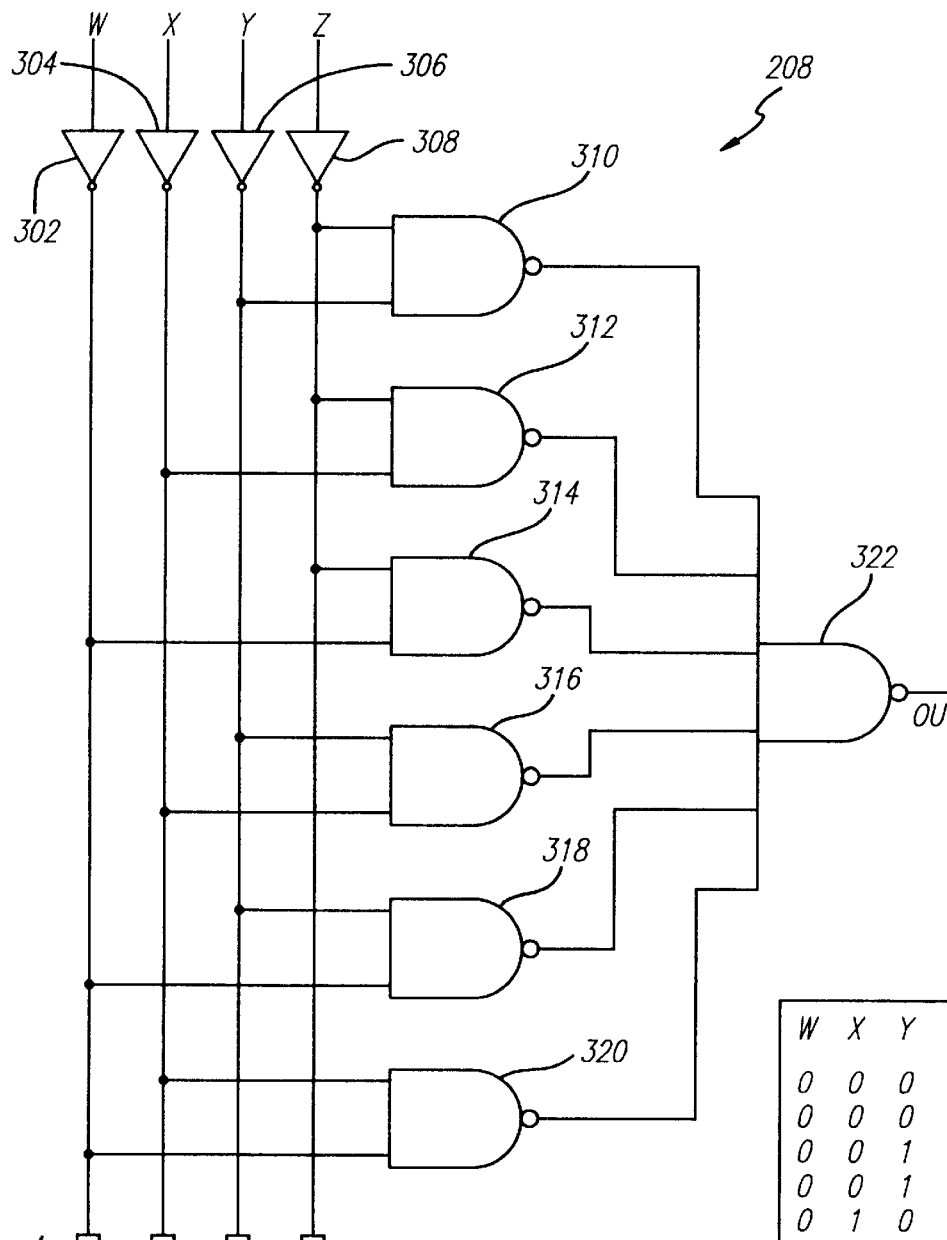
FIG. 3 shows encoding circuitry corresponding to the multiple match detection circuit of FIG. 2.

FIG. 3 shows a diagram of bus group detection circuit 208. Bus group detection circuit 208 comprises inverters 302–308 and NAND gates 310–322 coupled as shown in FIG. 3 for achieving the above truth table. Importantly, whenever the bus group detection circuit 208 has more than one active (i.e., "0") input, its output OUT is activated to a high level.

Multiple match detection circuit 200 further comprises an OR circuit comprising inverters 212 and 214 along with NAND gate 216, for providing the logical OR of the OUT nodes of bus group detection circuits 208 and 210. In this manner, if either of the two bus groups BG10 or BG32 have more than one active member, indicating a multiple match condition, the multiple match detection flag node 202 will be set to high, and will be set to zero otherwise.

It is to be appreciated that the number of match lines $2^N$ and the number of address bits "m" per bus group may be chosen to provide the appropriate number of input match lines while maintaining circuit simplicity. Thus, for example, for a 64-match line CAM (N=6), a number for "m" may be 3, and such a multiple match detection circuit would comprise N/m=2 bus groups (BG210 and BG543), each having $2^m = 2^3 = 8$ members. This multiple match detection circuit would further comprise: 128 pulldown transistors (T210_0 through T210_63 and T543_0 through T543_63), two bus group detection circuits (each having eight inputs and being capable of detecting when two or more inputs are active), and a two-input OR circuit for setting the multiple match flag to high when either or both of the bus group detection circuits detect multiple active inputs.

Figure 4:
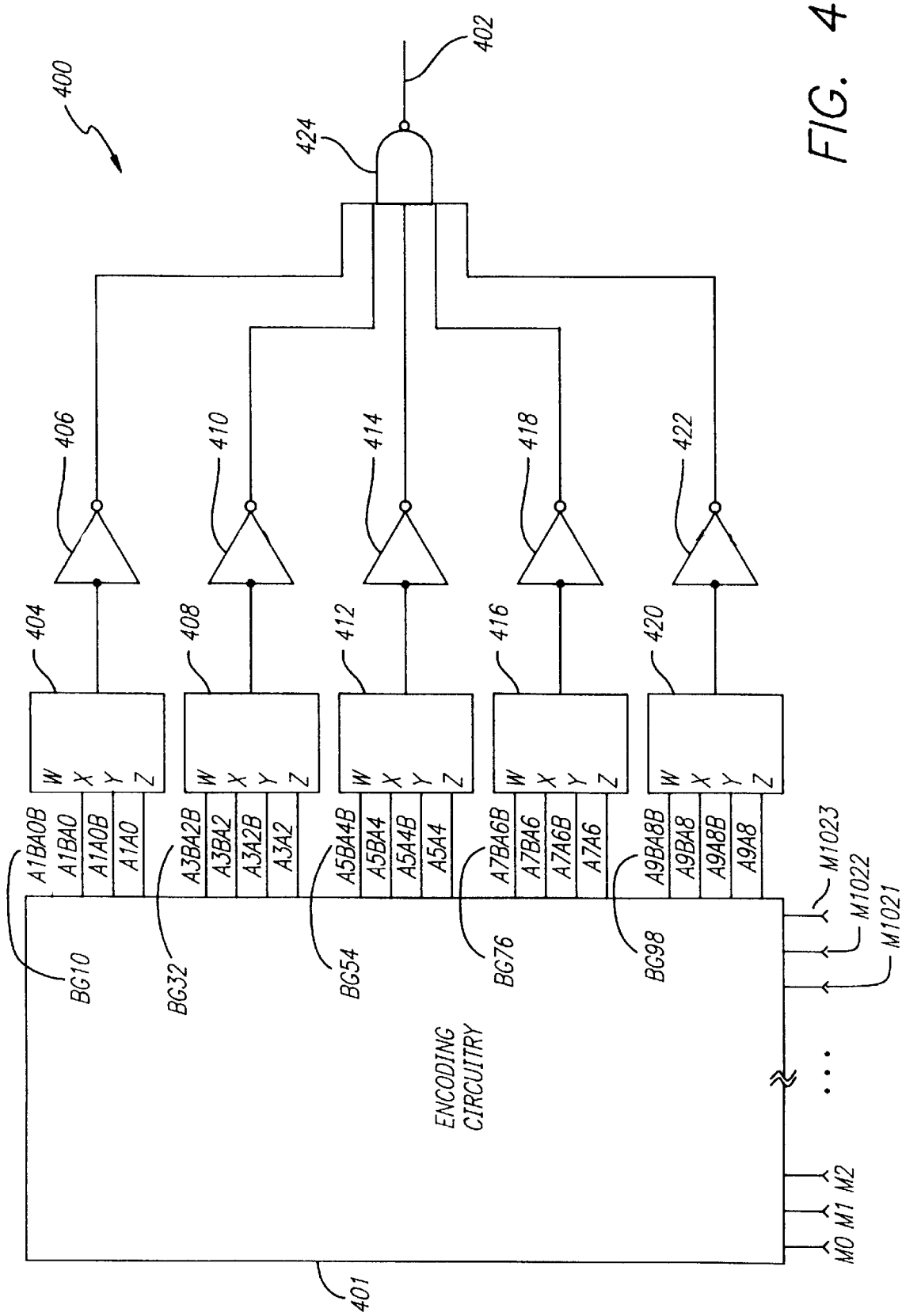

FIG. 4 illustrates a 1024 line multiple match detection circuit 400 according to a third embodiment of the present invention. In this embodiment, "m" is set equal to 2 and a plurality of bus groups having $2^2=4$ members each is provided for unary-encoding two consecutive address bits. Because 1024 match lines occupy an address space of 10 bits, there are 10/2=5 bus groups. Multiple match detection circuit 400 comprises 1024 inputs M0–M1023 for coupling to 1024 match lines of a CAM. Multiple match detection circuit 400 generates a single output at a match flag node 402 which is a logic high value when more than one input M0–M1023 is high, and which is low otherwise.

As shown in FIG. 4, multiple match detection circuit 400 comprises encoding circuitry 401 for receiving the input lines M0–M1023 and for driving a plurality of bus groups. Multiple match detection circuit 400 comprises a bus group BG10 for representing a unary-encoded form of the zeroth and first order bits of a 10-bit match line address, a bus group BG32 for unary-encoding the second and third order bits, a bus group BG54 for unary-encoding the fourth and fifth order bits, a bus group BG76 for unary-encoding the sixth and seventh orderbits, and a bus group BG98 for unary-encoding the eighth and ninth order bits.

FIG. 5 shows encoding circuitry 401 in detail. Encoding circuitry 401 comprises an encoding circuit 502 for driving a bus group BG10, the bus group BG10 comprising four members A1BA0B, A1BA0, A1A0B, and A1A0. The bus group BG10 is driven by the input lines M0–M1023 in a way which unary-encodes the zeroth order and first order bits of the address of active match lines onto its members. This is achieved in a manner similar to that described for the encoding circuit 204 of FIG. 2. For notational simplicity and clarity of disclosure, the term ADDR(n) will denote the 10-bit binary address of a match line coupled to the input line Mn, and the term ADDR_xy(n) will represent the xth and yth order bits of that address.

Encoding circuit 502 comprises 1024 n-channel transistors T10_0 through T10_1023 having their gates coupled to M0–M1023, respectively, and their current channels coupled between the members of bus group BG10 and ground for achieving this result. In particular, where ADDR_10(n) is 00 (i.e. for n=0, 4, 8, 12, 16, ..., 1012, 1016, and 1020) the drain of transistor T10_n is coupled to member A1BA0B. Where ADDR_10(n) is 01 (i.e., for n=1, 5, 9, 13, ..., 1013, 1017, and 1021) the drain of transistor T10_n is coupled to member A1BA0. Where ADDR_10(n) is 10 (i.e., for n=2, 6, 10, 14, ..., 1014, 1018, and 1022) the drain of transistor T10_n is coupled to member A1A0B. Finally, where ADDR 10(n) is 11 (i.e., for n=3, 7, 11, 15, ..., 1015, 1019, and 1023) the drain of transistor T10_n is coupled to member A1A0.

Encoding circuitry 401 further comprises encoding circuits 504, 506, 508, and 510 for driving the bus groups BG32, BG54, BG76, and BG98, respectively, for containing the appropriate unary-encoded portions of two adjacent bits of ADDR(n) of an active match line. The connections of the drains of the transistors comprising these encoding circuits is summarized in the following table:

TABLE 4

Matrix for Encoding Circuitry 501

| Bus Group | Address Bit Values | Transistor Connection |
|---|---|---|
| BG10 | ADDR_10(n) = 00 | T10_n to A1BA0B |
|  | = 01 | A1BA0 |
|  | = 10 | A1A0B |
|  | = 11 | A1A0 |
| BG32 | ADDR_32(n) = 00 | T32_n to A3BA2B |
|  | = 01 | A3BA2 |
|  | = 10 | A3A2B |
|  | = 11 | A3A2 |
| BG54 | ADDR_54(n) = 00 | T54_n to A5BA4B |
|  | = 01 | A5BA4 |
|  | = 10 | A4A4B |
|  | = 11 | A5A4 |
| BG76 | ADDR_76(n) = 00 | T76_n to A7BA6B |
|  | = 11 | A7BA6 |
|  | = 10 | A7A6B |
|  | = 11 | A7A6 |
| BG98 | ADDR_98(n) = 00 | T98_n to A9BA8B |
|  | = 01 | A9BA8 |
|  | = 10 | A9A8B |
|  | = 11 | A9A8 |

Table 4 is used as follows for determining the appropriate connections in FIG. 5. For each bus group, such as bus group BG76, it is required to connect each of transistors T76_0 through T76_1023 to the appropriate bus group member. Starting with n=0 and increasing n to n=1023, determine, for each value of n, whether ADDR_76(n) is equal to 00, 01, 10, or 11. Couple the transistor T76_n to the member of bus group BG76 indicated in the corresponding row of Table 2. Thus, for example, for n=367 (for which ADDR(n)= 0101101111, it is noted that ADDR_76(n)=01. Therefore, as indicated in Table 2, the drain of transistor T76_367 is to coupled to member A7BA6 in FIG. 3.

According to the present invention, whenever there is more than one active match line, there will always be at least one bus group having more than one active member. When there is only one active match line, there will be no more than one member of each bus group which is active. Accordingly, multiple match detection circuit 400 comprises bus group detection circuits 404, 408, 412, 416, and 420, each receiving four members of a respective bus group and having an output which is active (high) when more than one member of that bus group is active and inactive (low) otherwise. The bus group detection circuits are each substantially identical to the bus group detection circuit 208 of FIG. 3.

Multiple match detection circuit 400 further comprises a logical OR circuit comprising inverters 406, 410, 414, 418, and 422 coupled to the bus group detection circuits 404, 408, 412, 416, and 420, respectively, each having an output coupled to the input of a five-input NAND gate 424. The NAND gate 424 has an output directly connected to the multiple match flag node 402. The logical OR circuit activates the multiple match flag node 402 to a logic high value when at least one of the outputs of the bus detection circuits is high, as desired. Thus, the multiple match detection circuit 400 activates the multiple match flag node 402 whenever more than one match line coupled to the inputs M0–M1023 is active, and deactivates the multiple match flag node 402 otherwise.

Advantageously, the multiple match detection circuit 400 according to the present invention has a very fast response time. In particular, bus group detection circuits 404, 408, 412, 416, and 420 only require two levels of logic gates (see FIG. 3), and thus there is a total of only four layers of logic gates between the output of the encoding circuitry 401 and the multiple match flag output 402. Moreover, the encoding circuitry 401 itself operates quickly in a single logic step, wherein the bus group members are either pulled to ground or left in a high state.

Furthermore, for a $2^N$ match line circuits where N gets large, circuit complexity and power consumption are reduced as compared to other methods by the use of the match lines to directly drive N/m bus groups, each having $2^m$ members, for a total of $(2^m)$N/m members, which then in turn only drive the equivalent of N/m bus group detection circuits each having $2^m$ inputs, followed by a single N/m-input OR circuit. Thus, for the multiple match detection circuit 400 of FIG. 2, for 1024 match lines (N=10) with m=2, only 20 members are needed for crosscoupling to the 1024 match lines by means of the encoding circuits, and the equivalent of only five 4-input bus group detection circuits, and one 5-input OR circuit, are needed. As indicated above, circuit speed is also increased, especially because only a 20-input boolean operation on the states of the 20 bus group members are required. In contrast, as indicated previously, a 1024-match line CAM according to Montove would require a 2048-input boolean operation culminating in a single OR operation involving 1024 inputs, which would cause excessive delays due to excessive capacitances.

Figure 6:
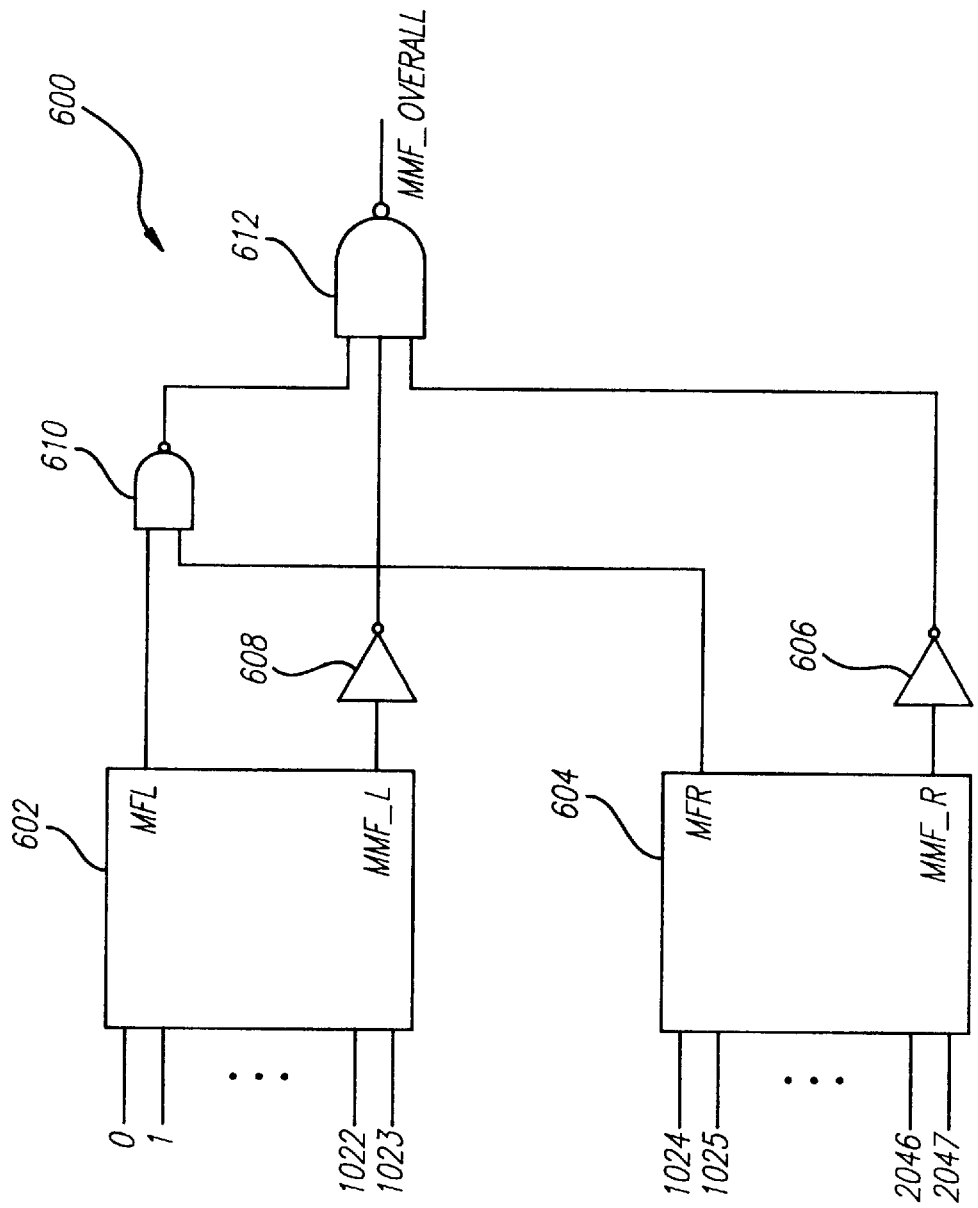
FIG. 6 shows a 2048 line multiple match detection circuit.

It is to be appreciated that where necessary, two identical circuits such as multiple match detection circuit 400 may be used together to form a 2048 line multiple match detection circuit. FIG. 6 shows a 2048 line multiple match detection circuit 600. Multiple match detection circuit 600 comprises a first 1024-line multiple match detection circuit 602 and a second 1024-line multiple match line circuit 604. Each of the circuits 602 and 604 comprises circuitry which is substantially identical to the multiple match detection circuit 400 of FIG. 4 for producing a first multiple match flag MMF_L and a second multiple match detection flag MMF_R, respectively. Additionally, each of the circuits 602 and 604 comprises circuitry known in the art for generating single match flags MFL and MFR, respectively, which are set high when one or more of the 1024 input lines are active.

Multiple match detection circuit 600 further comprises inverters 606 and 608, along with NAND gates 610 and 612 coupled as shown in FIG. 6, for producing the following boolean function at an output node MMF_OVERALL: (MMF_L) OR (MMF_R) OR (MFR AND MFL). In this manner the flag MMF_OVERALL will be set high if one or both sides has a multiple match, or if both sides have a single match, as desired. Otherwise, the MMF_OVERALL flag will be set to low, as desired.

It is apparent that many modifications and variations of the present invention as set forth here may be made without departing from the spirit and scope thereof. The specific embodiments described here and above are given by way of example only and the invention is limited only by the terms of the appended claims.

What is claimed is:

1. A multiple match detection circuit for use with a content addressable memory having a plurality of match lines, said multiple match detection circuit for detecting whether two or more match lines are simultaneously active, comprising:

at least one bus group having a plurality of members;

a plurality of encoding circuits, each encoding circuit for coupling to a one of the match lines, each encoding circuit being coupled to each of said bus groups for activating a single member of said bus group responsive to the activation of its associated match line;

at least one bus group detection circuit, each bus group detection circuit corresponding to a one of said bus groups and coupled thereto, said bus group detection circuit having an output which is active when more than one of said members of said one bus group is active;

a logical OR circuit coupled to said bus group detection circuits, said logical OR circuit having an output which is active when at least one of said outputs of said bus group detection circuits is active;

wherein each of said encoding circuits activates a unique set of members responsive to the activation of its associated match line;

whereby the output of said logical OR circuit is active when more than one match line is active.

2. The multiple match detection circuit of claim 1, said match lines each having an address, wherein each bus group corresponds to a unique set of m bits of said match line address having $2^m$ possible values, and wherein said bus group comprises $2^m$ members capable of unary-encoding each of said $2^m$ possible values.

3. The multiple match detection circuit of claim 2, each of said encoding circuits comprising:

an input lead for coupling to the match line associated with said encoding circuit;

a plurality of activation circuits, one activation circuit for each bus group, for activating a single member of each bus group according to the address of the match line associated with said encoding circuit;

whereby the single member of each bus group activated by said encoding circuit corresponds to a unary-encoded form of said m bits of the address of the activated match line.

4. The multiple match detection circuit of claim 3, each of said activation circuits comprising:

a transistor having a gate coupled to the match line, a first current node coupled to said single member of said bus group, and a second current node coupled to a constant voltage source.

5. The multiple match detection circuit of claim 4, said address having N bits, said multiple match detection circuit comprising:

N/m bus groups, each bus group having $2^m$ members;

$2^N$ encoding circuits, each encoding circuit comprising N/m activation circuits;

N/m bus group detection circuits, each bus group detection circuit corresponding to a one of said N/m bus groups, each bus group detection circuit comprising $2^m$ inputs and an output, each input being coupled to a one of said members of said bus group; and a logical OR circuit having N/m inputs each coupled to the output of a one of said N/m bus group detection circuits.

6. The multiple match detection circuit of claim 5, wherein m is equal to 1.

7. The multiple match detection circuit of claim 5, wherein is equal to 2.

8. The multiple match detection circuit of claim 7, wherein N is equal to 10.

9. A method of detecting whether two or more match lines are simultaneously active in a content addressable memory, each of the match lines having a unique N-bit address, comprising the steps of:

encoding the N-bit address of a first active match line into a first set of N/m unary-encoded address portions;

encoding the N-bit address of a second active match line into a second set of N/m unary-encoded address portions;

mapping said first and second sets into a common set of N/m unary-encoded address portions; and activating a multiple match flag if at least one of said unary-encoded address portions contains two or more active members.

10. The method of claim 9, wherein each of said N/m unary-encoded address portions are expressed as logic levels at $2^m$ electrical nodes.

11. The method of claim 10, wherein said step of mapping comprises the step of determining the logical OR of the active logic levels corresponding to said first and second sets of unary-encoded address portions.

12. The method of claim 11, wherein m is equal to 1 and wherein there are N unary-encoded address portions each expressed as logic levels at 2 electrical nodes.

13. The method of claim 11, wherein m is equal to 2 and N is equal to 10, wherein there are 5 unary-encoded address portions each expressed as logic levels at 4 electrical nodes.

14. A circuit, comprising:

means for coupling to a plurality of sequentially-addressed input lines;

means for encoding the address of each active input line into a plurality of unary-encoded address portions, each unary-encoded address portion comprising members;

means for activating a match flag if at least one of said unary-encoded address portions contains two or more active members.

15. The circuit of claim 14, said unary-encoded address portions being contained on bus groups, said means for encoding being coupled to said means for activating and comprising:

a first node for coupling to said active input line;

a plurality of switch transistors, each of said switch transistor corresponding to a one of said bus groups and having a control node coupled to said first node, a source coupled to a constant voltage source, and a drain coupled to a one of said members of said one bus group;

wherein said one of said members is selected to correspond to the unary-encoded address portion corresponding to the address of the input line to which said first node is coupled.

16. The circuit of claim 15, said members of said bus groups being coupled through a pullup means to a high logic level, said constant voltage source being at a low logic level, said single member of said bus group being pulled low and the other members of said bus group remaining high for indicating a unary-encoded address portion.

17. The circuit of claim 16, wherein said means for activating comprises:

means for detecting for each bus group whether that bus group contains at least two active members and for activating a bus group detect signal responsive thereto;

means for determining the logical OR of said bus group detect signals for producing said multiple match flag.

* * * * *